United States Patent [19]

Bryant

[11] Patent Number: 5,512,517

[45] Date of Patent: Apr. 30, 1996

[54] SELF-ALIGNED GATE SIDEWALL SPACER IN A CORRUGATED FET AND METHOD OF MAKING SAME

[75] Inventor: Andres Bryant, Chittenden County, Vt.

[73] Assignee: International Business Machines Corporation, Armonk, N.Y.

[21] Appl. No.: 428,739

[22] Filed: Apr. 25, 1995

[51] Int. Cl.$^6$ .............................. H01L 21/44; H01L 21/48
[52] U.S. Cl. ................................................. 437/203
[58] Field of Search .................... 437/203, 40 RG, 437/41 RG; 257/330, 331, 332, 333, 334

[56] References Cited

U.S. PATENT DOCUMENTS

| | | |
|---|---|---|
| Re. 33,972 | 6/1992 | Garnache et al. . |
| 4,635,084 | 1/1987 | Benjamin et al. . |
| 4,638,344 | 1/1987 | Cardwell et al. . |
| 4,648,173 | 3/1987 | Malaviya . |
| 4,670,764 | 6/1987 | Benjamin et al. . |
| 4,701,996 | 10/1987 | Calviello . |
| 4,835,584 | 5/1989 | Lancaster ................... 357/23.1 |
| 4,835,585 | 5/1989 | Panousis ................... 437/203 |
| 4,838,991 | 6/1989 | Cote et al. . |
| 5,049,515 | 9/1991 | Tzeng . |
| 5,122,848 | 5/1992 | Lee et al. . |
| 5,132,238 | 6/1992 | Murakami et al. . |
| 5,281,547 | 1/1994 | Uchiyama et al. ......... 437/203 |

OTHER PUBLICATIONS

Hisamoto et al. "A Fully Depleted Lean Channel Transistor (DELTA) A Novel Vertical Ultrathin SOI MOSFET" IEEE Electron Device Letters vol. 11 No. 1 Jan. 1990.

A. Davis and Kenney "Corrugated Capacitor Structure and Process" IBM Technical Disclosure Bulletin vol. 30 No. 3 Aug. 1987.

Sunouchi et al. "A Surrounding Gate Transistor (SGT) Cell for 64/256 Mbit DRAMs" IEEE Electron Devices Meeting Washington D.C. Dec. 3–6, 1989.

Kenney "Spacer–Defined Strap" IBM Technical Disclosure Bulletin vol. 32 No. 4B Sep. 1989.

*Primary Examiner*—George Fourson
*Assistant Examiner*—Brian K. Dutton
*Attorney, Agent, or Firm*—Whitham, Curtis, Whitham & McGinn; Howard J. Walter

[57] ABSTRACT

A self-aligned gate sidewall spacer and method of forming the sidewall spacer in a corrugated FET structure, comprising the steps of depositing a first oxide layer on a substrate; forming a substrate trench, having a substrate trench bottom and substrate trench sidewalls in the substrate; forming a gate electrode trench intersecting the substrate trench and filling the gate electrode trench with gate polysilicon for forming a gate electrode, the gate electrode having first and second gate sidewalls; depositing a second oxide layer over the gate electrode trench and substrate trench; and etching the second oxide layer for forming a sidewall spacer on each of the first and second gate sidewalls.

13 Claims, 8 Drawing Sheets

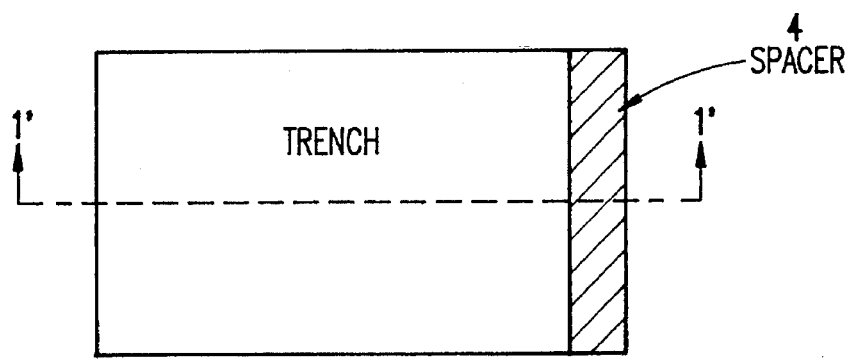
PRIOR ART FIG.1A
PRIOR ART FIG.1B
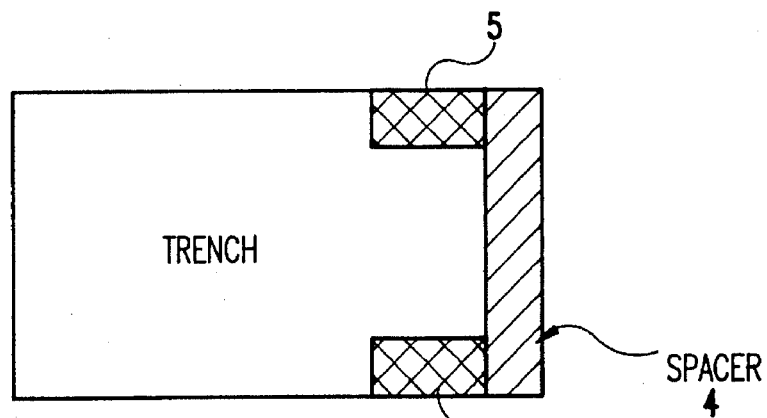
PRIOR ART FIG.2

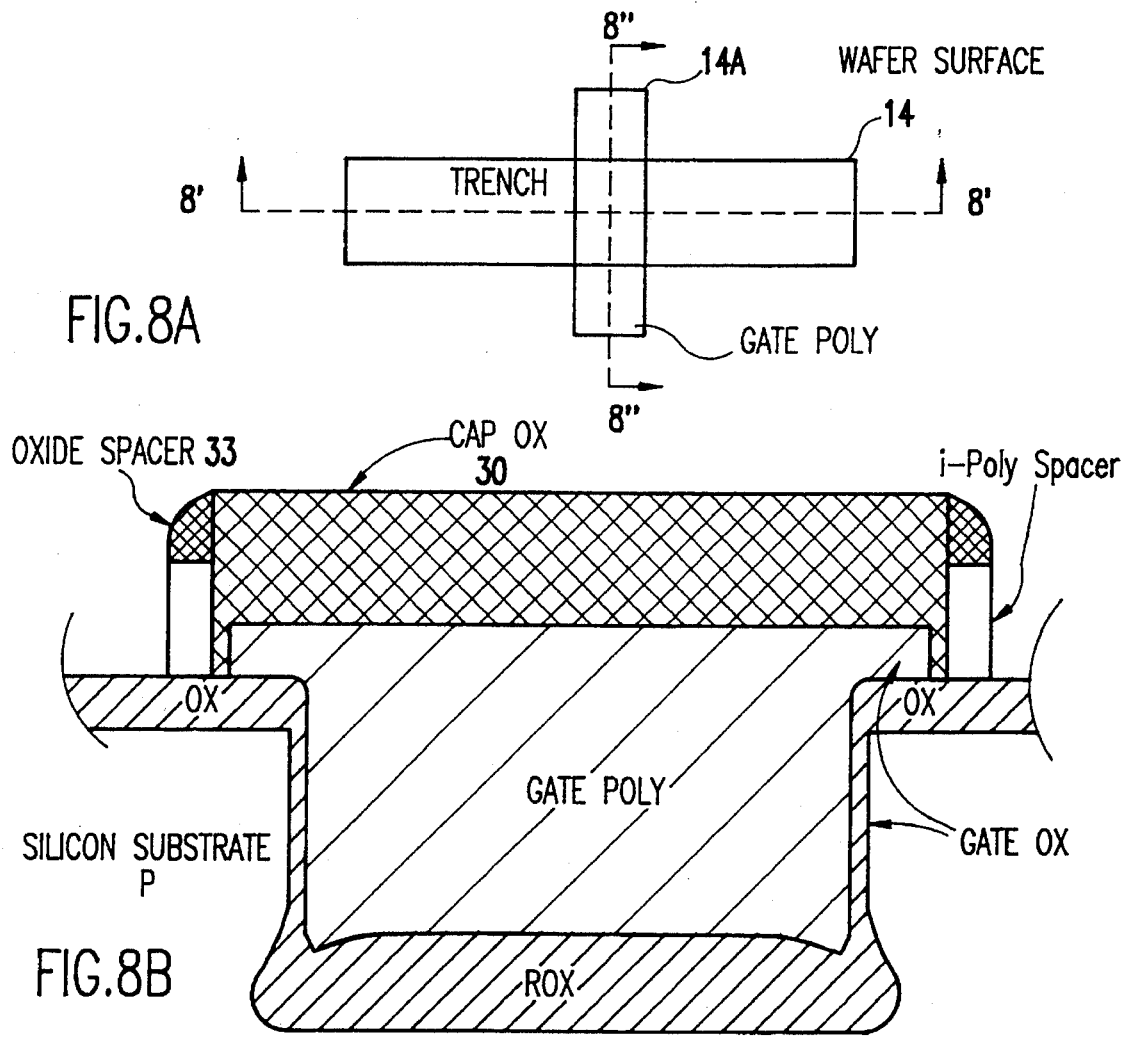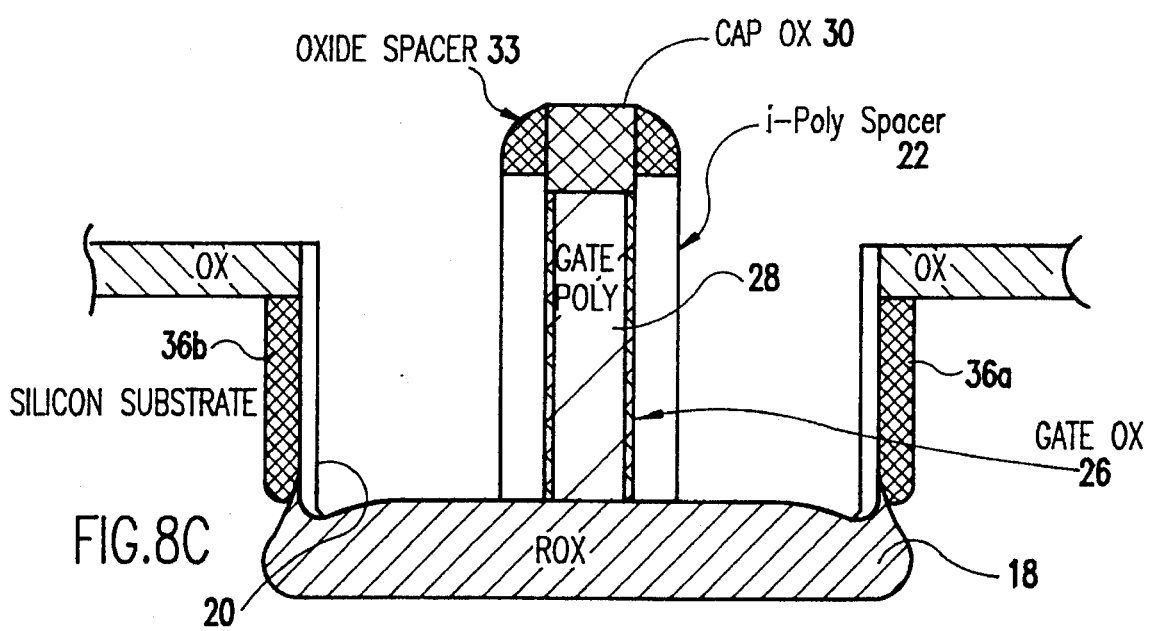

SELF-ALIGNED GATE SIDEWALL SPACER IN A CORRUGATED FET AND METHOD OF MAKING SAME

BACKGROUND OF THE INVENTION

1. Field of the Invention

The present invention generally relates to semiconductor devices formed using sidewall image transfer, and, more particularly, to a self-aligned gate sidewall spacer and method of forming the sidewall spacer in a corrugated FET structure, whereby a sidewall spacer is formed exclusively on a sidewall of the gate electrode trench, as opposed to the substrate trench sidewalls.

2. Description of the Related Art

Vertical sidewall field effect transistors (FETs) have been previously proposed to increase device density in Dynamic Random Access Memory (DRAM) cells. The vertical FET is built along the sidewall of a trench with its source at the bottom of the trench and its drain at the top. Current flows between the source and drain in a direction perpendicular to the plane of the wafer surface and thus the depth of the trench is largely determined by the desired source to drain channel length.

It is also possible to build horizontal sidewall FETs along trench sidewalls. In the horizontal sidewall FET, current flows in the direction parallel or horizontal to the plane of the wafer surface, and thus the trench depth adds to the width of the FET.

The density advantage of horizontal FETs over conventional planar FETs is illustrated by the following example. If horizontal FETs having the same width as the depth of the trench are built within the trenches that are 1.0 μm deep and 0.5 μm wide at a distance of 1.0 μm between trenches, then there are 2.0 μm of device width (a 1.0 μm wide horizontal sidewall FET on each trench sidewall), per 1.0 μm of distance along the wafer surface.

To achieve an equal amount of current drive, a conventional planar device would require 2 μm of wafer surface. Therefore, in the given example, the use of horizontal sidewall FETs offers twice the current drive advantage over conventional planar FETs. In summary, the effective width of FETs can be increased by "corrugating" the silicon surface along the direction of the device width to produce "corrugated" FETs.

One problem associated with horizontal sidewall FETs, however, is how to form gate sidewall spacers to control gate-to-drain spacing in order to prevent high parasitic series resistance (underlap) or high overlap capacitance (excessive overlap). This type of problem is associated with a class of three dimensional problems that are confronted whenever it is required to differentiate between the vertical walls of a trench during a process.

For example, referring to FIGS. 1A and 1B, if it were necessary to form a sidewall spacer 4 only along one wall of a trench as illustrated, one way to achieve this objective would involve the following process. First a film is deposited over the trench using Chemical Vapor Deposition (CVD) and is etched (by for example, reactive ion etching (RIE)) to form a spacer. The spacer would be therefore exist on all walls of the trench. It is possible to remove unwanted spacers by masking and using an isotropic etch. However, such a technique is not self-aligned, resulting in spacers 5 and 6 (see FIG. 2) that will extend along trench walls where they are not desired.

In light of the foregoing, there exists a need for a spacer that can be formed exclusively on a single sidewall of a trench defined by the gate polysilicon to serve as a self-aligned gate sidewall spacer in a corrugated FET.

SUMMARY OF THE INVENTION

The present invention is directed to a self-aligned gate sidewall spacer in a corrugated FET and a method of making the same, which substantially obviates one or more of the problems due to the limitations and disadvantages of the related art.

To achieve these and other advantages and in accordance with the purpose of the invention, as embodied and broadly described, the invention provides for a corrugated field effect transistor (FET) structure, comprising a substrate having a substrate trench defining a substrate trench bottom and substrate trench sidewalls; a gate electrode, having first and second gate electrode sidewalls, intersecting the substrate trench; an intrinsic polysilicon spacer formed on each of the first and second gate electrode sidewalls; and source and drain regions in the substrate trench sidewalls in selective communication with the gate electrode.

In another aspect, the invention provides for a method of fabricating a self-aligned gate sidewall spacer in a corrugated FET, the method comprising the steps of depositing a first oxide layer on a substrate; forming a substrate trench in the substrate, thereby defining a substrate trench bottom and substrate trench sidewalls; forming a gate electrode trench intersecting the substrate trench and filling the gate electrode trench with gate polysilicon for forming a gate electrode, the gate electrode defining first and second gate sidewalls; depositing a second oxide layer over the gate electrode trench and substrate trench; and etching the second oxide layer for forming a sidewall spacer on each of the first and second gate sidewalls.

In still another more particular aspect, the invention provides a method for forming a self-aligned gate sidewall spacer in a corrugated field effect transistor (FET) structure, comprising the steps of (1) depositing a first oxide layer on a substrate; (2) etching a substrate trench in the first oxide layer and the substrate, thereby defining a substrate trench bottom and substrate trench sidewalls; (3) forming nitride spacers on the substrate trench sidewalls; (4) growing a thermal oxide pad layer on the substrate trench bottom; (5) removing the nitride spacers and depositing a first layer of tetraethylorthosilicate (TEOS) on the substrate trench sidewalls; (6) overfilling the substrate trench with intrinsic polysilicon; (7) depositing a nitride layer; (8) etching a gate electrode image in the nitride layer and intrinsic polysilicon for forming a gate electrode trench; (9) growing a gate oxide on walls of the gate electrode trench; (10) overfilling the gate electrode trench with gate polysilicon for forming a gate electrode having first and second gate sidewalls; (11) recessing the gate polysilicon to a level below that of the nitride layer; (12) filling the recess with a second layer of TEOS; (13) removing the nitride layer; (14) depositing a second oxide layer; (15) etching the second oxide layer; (16) etching the intrinsic polysilicon, stopping at the thermal oxide pad, thereby forming intrinsic polysilicon spacers on each of the first and second gate sidewalls; (17) forming source and drain regions in the substrate trench sidewalls; (18) removing the intrinsic polysilicon spacers selectively to oxide; (19) overfilling the substrate and gate electrode trenches with phosphosilicate glass (PSG) and planarizing the PSG to a level above the second layer of TEOS; and (20) etching contact holes to expose the source and drain regions.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which:

FIG. 1A is a top cross-sectional view of a single sidewall spacer formed on one wall of a trench of a conventional device;

FIG. 1B is a side cross-sectional view, taken along line 1'—1' of FIG. 1A, showing the single sidewall spacer formed on one wall of the trench of a conventional device;

FIG. 2 is a top cross-sectional view of a trench showing undesired spacer residuals of a conventional device;

FIG. 8A is a top view of the substrate trench and gate electrode trench after Step 5;

FIG. 8B is a side cross-sectional view of the gate electrode trench, taken along line 8"—8" of FIG. 8A, following the Step 5 of the process of the present invention;

FIG. 8C is a side cross-sectional view of the substrate trench, taken along line 8'—8' of FIG. 8A, following Step 5 of the process of the present invention;

DETAILED DESCRIPTION OF A PREFERRED EMBODIMENT OF THE INVENTION

Figure 3:
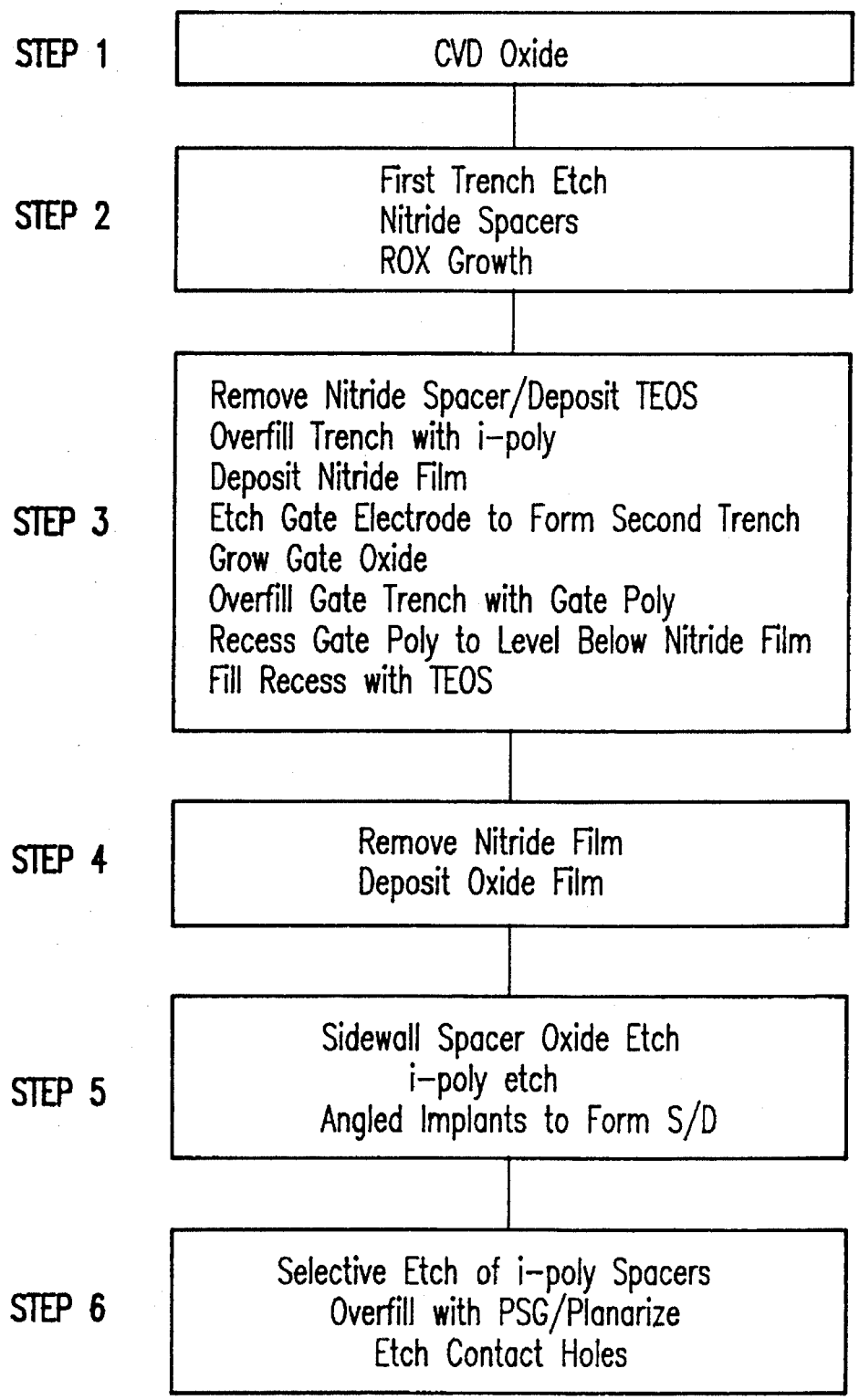
FIG. 3 is a process flow diagram illustrating Steps 1–6 of the process of the preset invention.

Referring now to the drawings, and more particularly to FIG. 3, there is shown a process flow diagram for making a self-aligned gate sidewall spacer for a corrugated n-type FET in accordance with the present invention. In general, the process consists of the following steps, which are summarized herein for ease of discussion:

Step 1—depositing a first oxide layer on a substrate;

Step 2—forming a substrate trench and growing a thermal oxide pad at the bottom of the trench;

Step 3—forming a gate electrode trench and filling the gate trench with gate polysilicon to form a gate electrode;

Step 4—depositing a second oxide layer over the gate electrode trench;

Step 5—etching the second oxide layer to form gate electrode sidewall spacers and forming source and drain regions in the substrate trench sidewalls; and Step 6—overfilling with phosphosilicate glass (PSG) and etching contact holes to expose the source and drain sidewalls.

Figure 4:
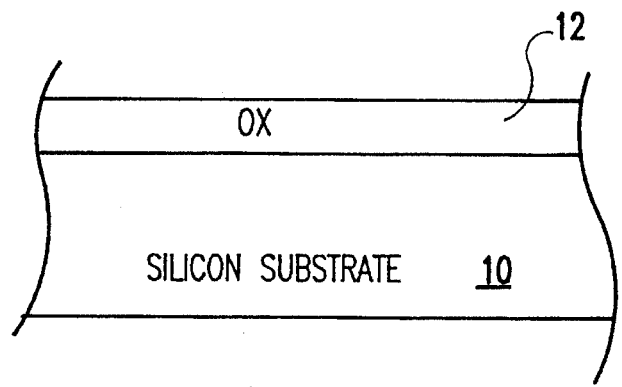
FIG. 4 is a side cross section of the substrate following Step 1.

Each of the above summarized process steps will now be discussed in turn in greater detail. The illustrated nFET process begins with the a p-type silicon substrate 10 as shown in FIG. 4, which is fabricated by conventional means such as, for example, boron doping. Alternatively, pFETs could be built by forming an n-well on the substrate trench sidewalls at a later stage in the process.

The process begins in Step 1 with the formation, by chemical vapor deposition (CVD), of a thick layer of oxide 12, such as e.g., silicon dioxide, over the wafer substrate 10 as shown in FIG. 4. The thickness of the layer is approximately 3000 Å, but it may be increased or decreased depending on the desired depth of the trench.

Figure 5A:
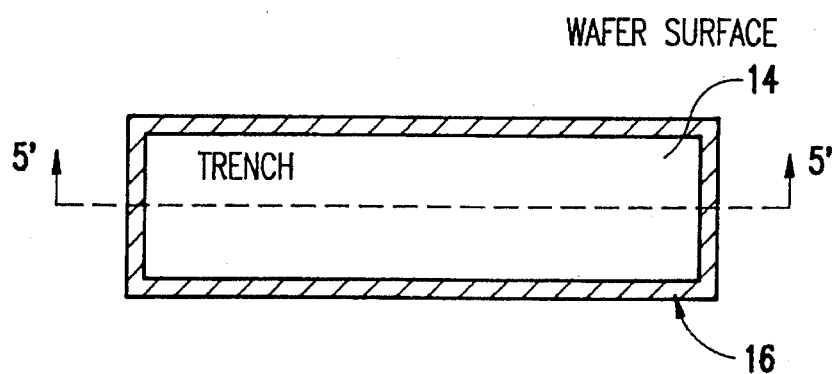
FIG. 5A is a top view of the substrate trench following Step 2.
Figure 5B:
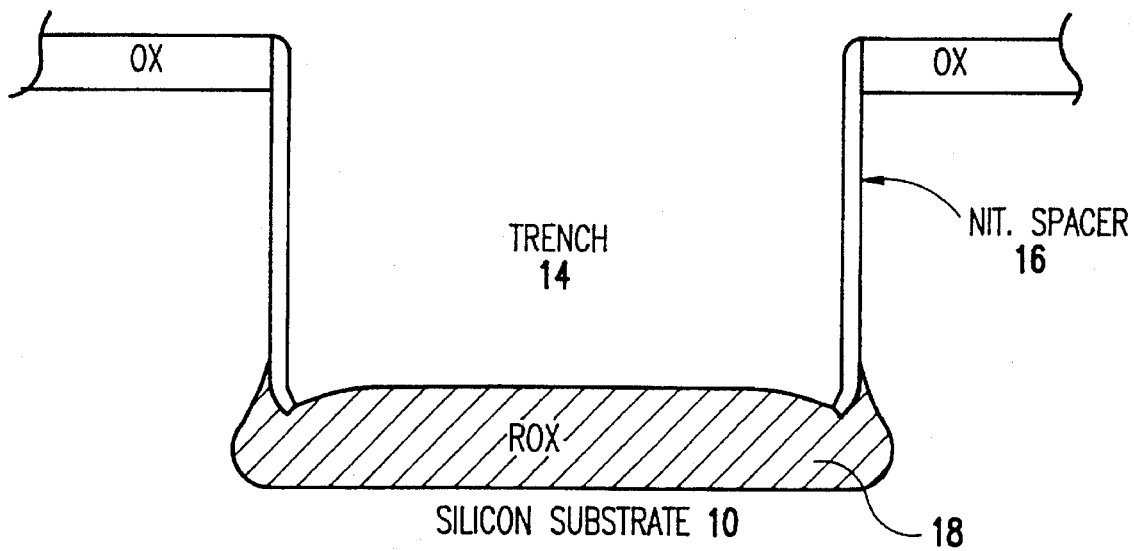
FIG. 5B is a side cross-sectional view of the substrate trench, taken along the line of 5'—5' in FIG. 5A, following Step 2 of the process of the present invention.

Process Step 2 is illustrated in FIGS. 5A and 5B, and consists of several sub-steps. First, using anisotropic reactive ion etching (RIE), a substrate trench 14 is etched into the wafer substrate 10 to a desired length, depth, and width, depending on the desired performance characteristics of the resulting device. Silicon nitride ($Si_3N_4$) spacers 16 are formed on the trench sidewalls by CVD and are then subject to a directional RIE. A recessed oxidation or ROX layer 18 (a thermally grown thick silicon dioxide) is then grown to selectively form a thick oxide pad of about 3000 Å at the bottom of the substrate trench 14. The thick oxide pad can be of variable thickness, the particular thickness being a function of the desired depth of the trench and the number and types of follow-on etch steps. The purpose of the ROX growth is to serve as an etch stop fur later RIE procedures.

Figure 6A:
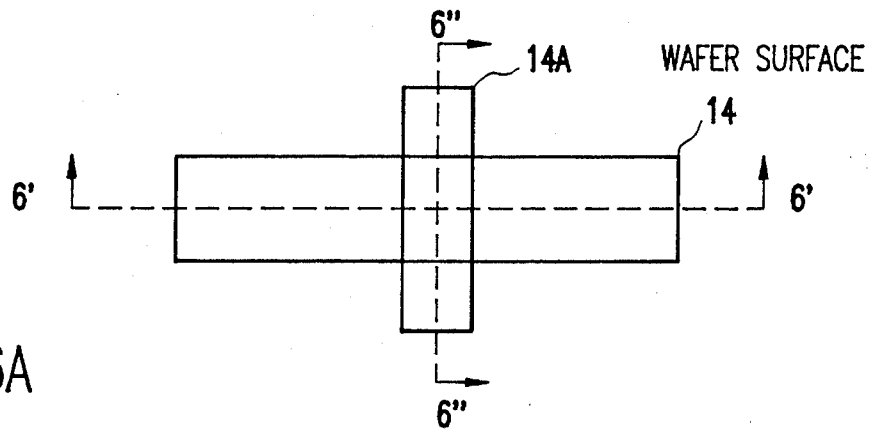
FIG. 6A is a top view of the substrate trench and gate electrode trench after Step 3.
Figure 6B:
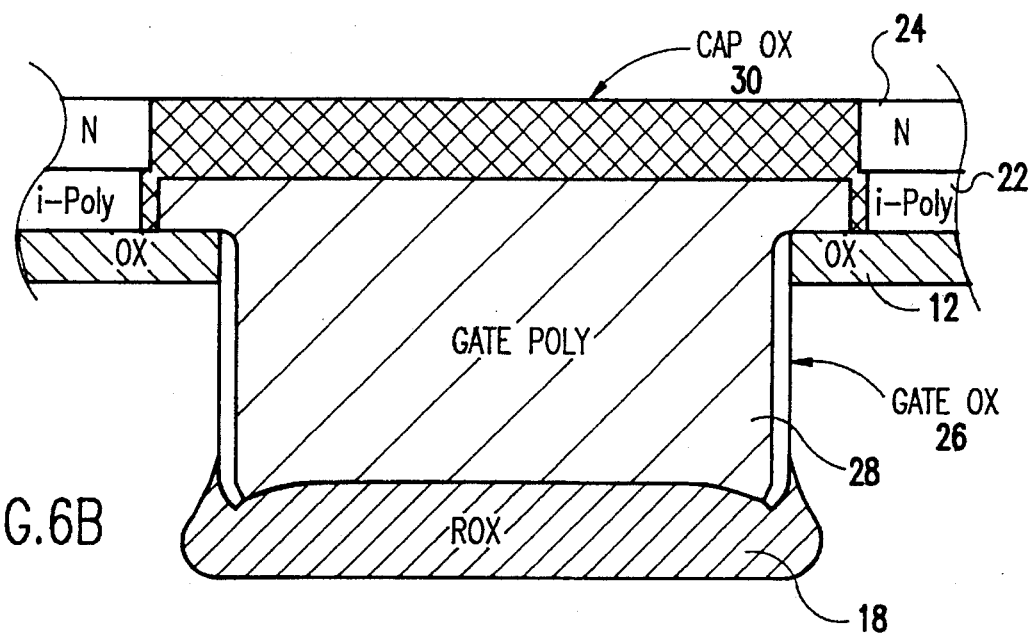
FIG. 6B is a side cross-sectional view of the gate electrode trench, taken along the line 6"—6" in FIG. 6A, following Step 3 of the process of the present invention.
Figure 6C:
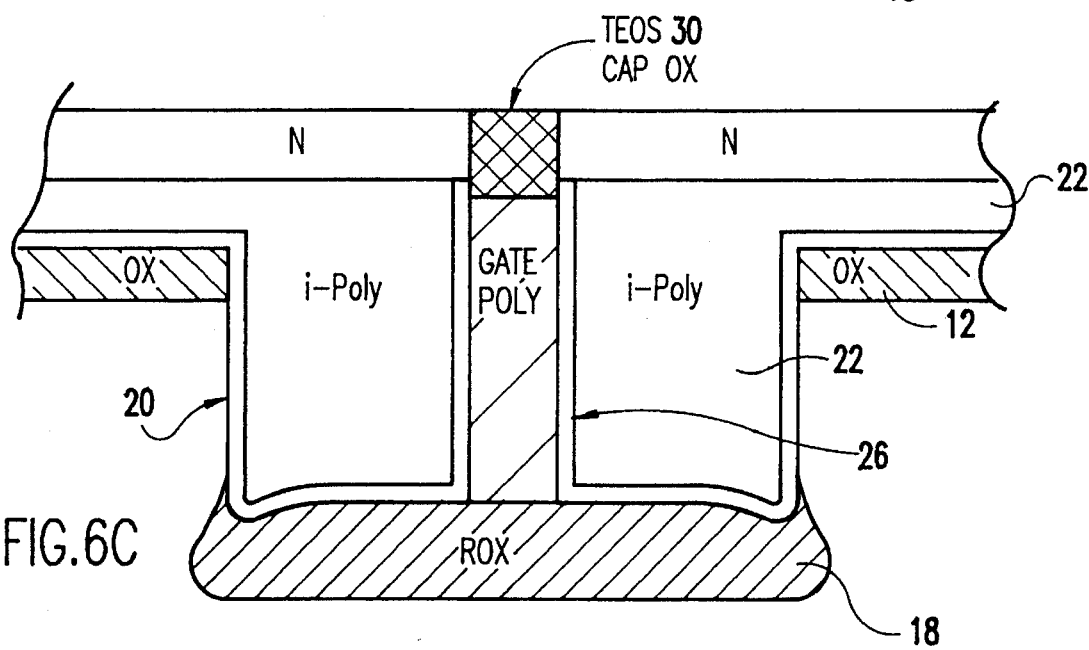
FIG. 6C is a side cross-sectional view of the substrate trench, taken along line 6'—6' in FIG. 6A, following the Step 3 of the process of the present invention.

Referring to FIGS. 6A to 6C, the process continues in Process Step 3 with the removal of the nitride spacers 16 by an anisotropic RIE followed by the deposition of about 100 Å of tetraethylorthosilicate (TEOS) 20 by chemical vapor deposition. The substrate trench 14 is then overfilled with CVD deposited intrinsic polysilicon (i-poly) 22 and planarized to a level above the thick oxide layer 12 on the silicon surface. A silicon nitride layer 24 of about 2500 Å is then CVD deposited on top of the i-poly layer 22. An image of the gate electrode is then etched by an anisotropic RIE into the nitride layer 24 and through the i-poly layer 22, forming a gate electrode trench 14A. The etch stops for the RIE are the thick oxide layer 12 on wafer surface and the ROX pad 18 at the bottom of substrate trench 14.

A gate oxide 26 is then grown on the silicon sidewall surfaces and i-poly surface. The gate electrode trench 14A is then overfilled with gate polysilicon 28 (gate poly) by CVD. The gate poly 28 is then selectively recessed by RIE to a level below that of the nitride layer 24. The resulting recess is then filled with another layer of TEOS and planarized using the nitride layer 24 as an etch stop, thereby forming an oxide cap 30 on the gate. At this point the gate poly 28 is completely encapsulated by oxide.

Figure 7A:
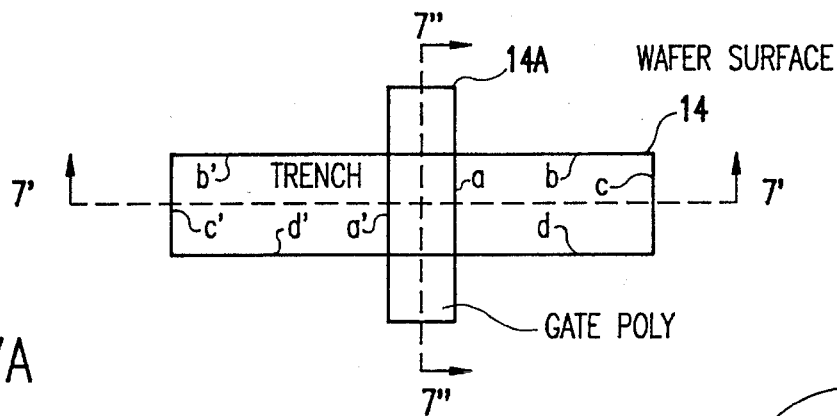
FIG. 7A is a top view of the substrate trench and gate electrode trench after Step 4.
Figure 7B:
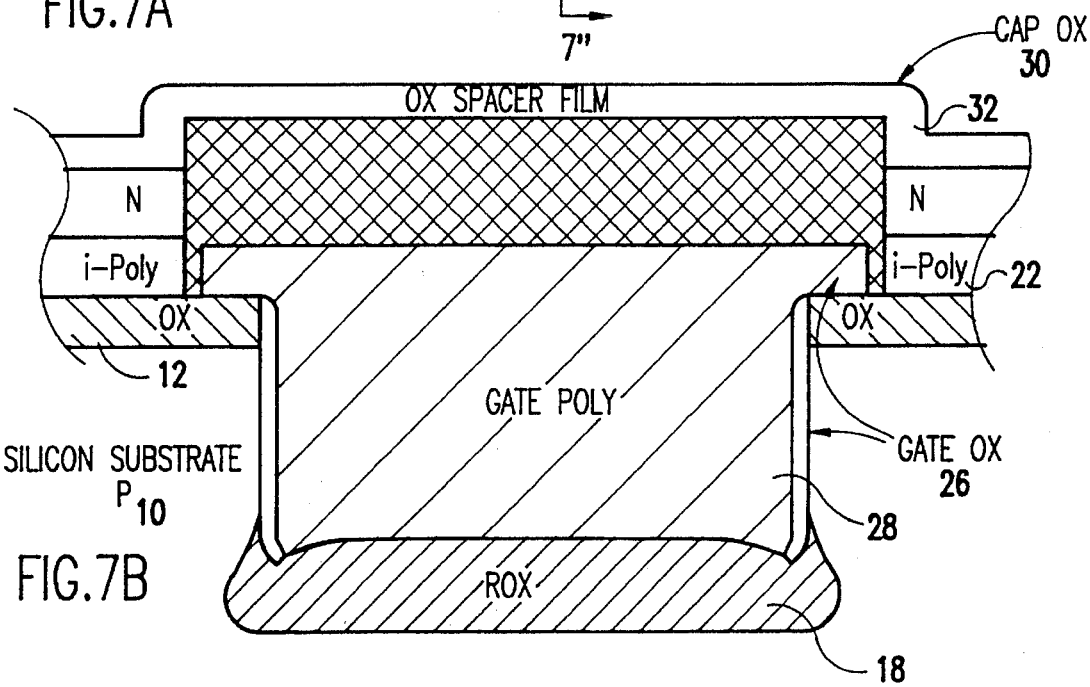
FIG. 7B is a side cross-sectional view of the gate electrode trench, taken along line 7"—7" of FIG. 7A, following Step 4 of the process of the present invention.
Figure 7C:
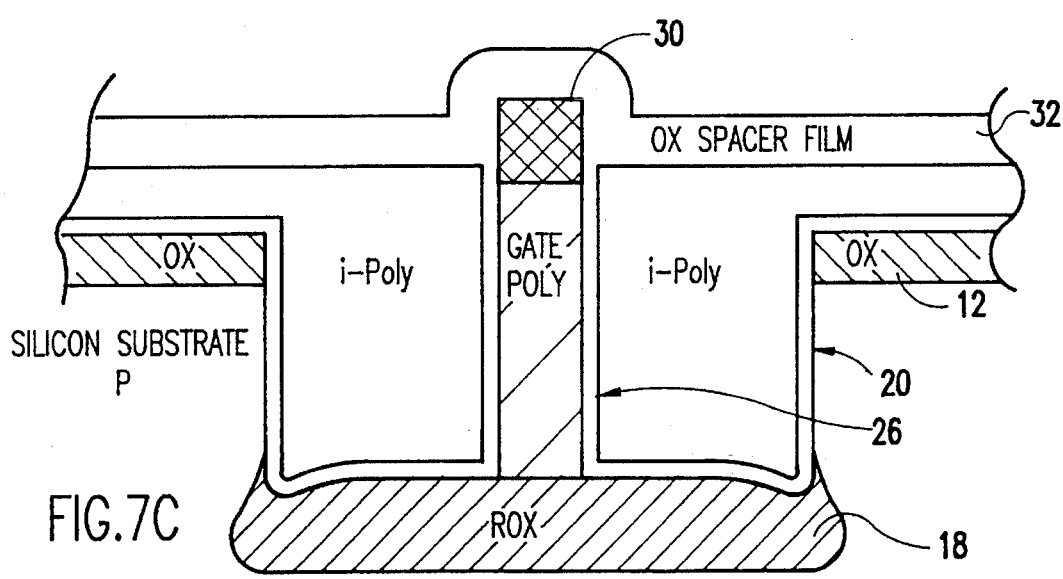
FIG. 7C is a side cross-sectional view of the substrate trench, taken along the line 7'—7' of FIG. 7A, following Step 4 of the process of the present invention.

Next, referring to FIGS. 7A to 7C, the process of Step 4 is illustrated. Referring to FIG. 7A, it is important to note that it is in Process Step 4 where the gate electrode sidewalls (a and a') are differentiated from the other substrate trench sidewalls (b, b', c, c', d, and d') for the resulting sidewall spacer formation. First, the nitride layer 24 is removed by an anisotropic RIE and a second silicon dioxide layer 32 is deposited by CVD. The thickness of this second oxide layer 32 determines the resulting spacer width. The desired spacer width depends on the particular junction technology and the desired junction overlap.

As will be seen more clearly after Step 5, the topographical application of the second oxide layer in Step 4 defines the spacer location on the trench sidewall of the gate electrode trench as opposed to the substrate trench sidewalls.

Figure 9:
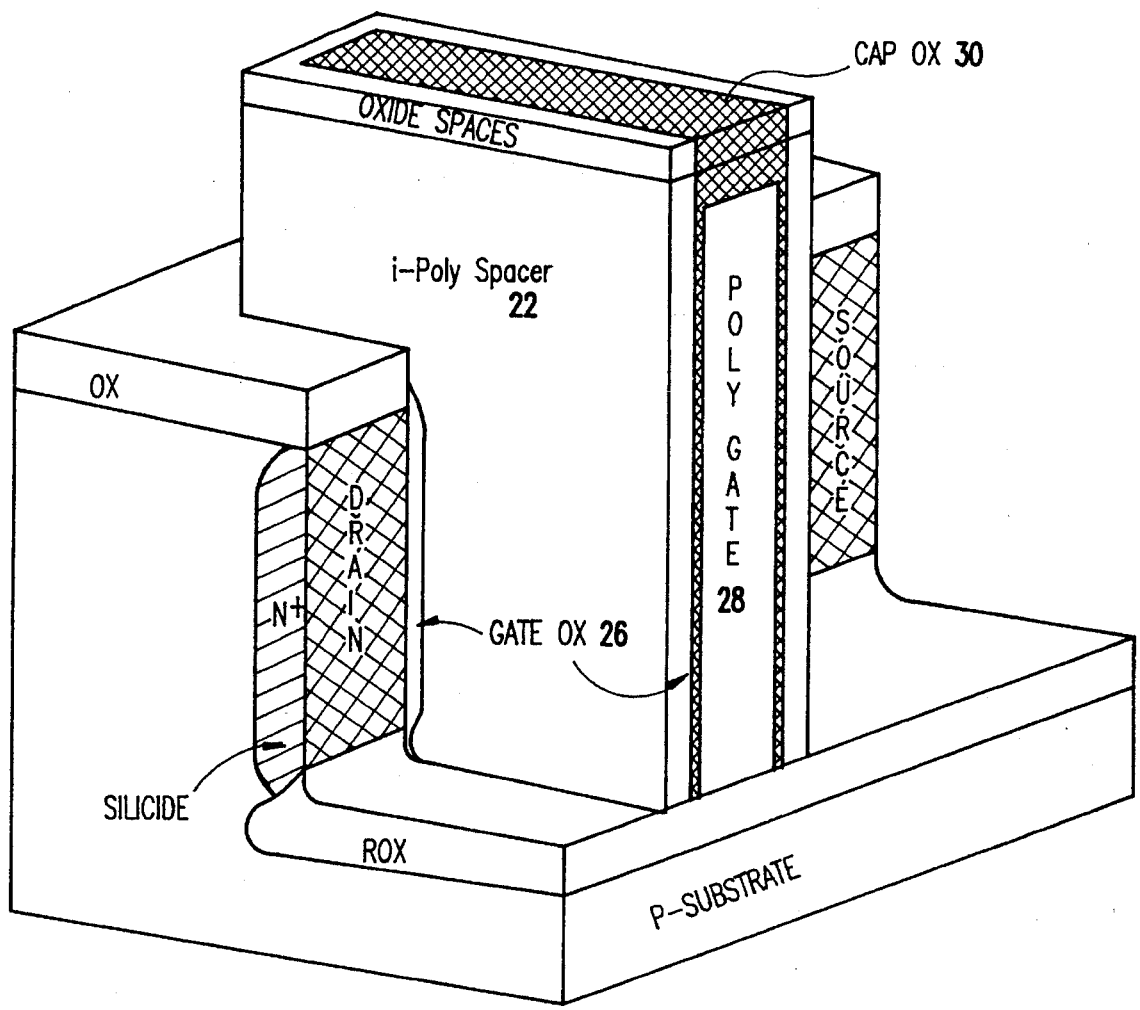
FIG. 9 is perspective view of the resulting single sidewall corrugated FET structure following Step 5.

In Process Step 5, as shown in FIGS. 8A to 8C, the second oxide layer 32 is subjected to an anisotropic RIE to form the gate sidewall spacer 33, stopping on the i-poly layer 22. The i-poly layer 22 is then subjected to an anisotropic RIE, stopping at the ROX pad 18, thereby forming concentric trenches around the gate polysilicon pillar. Angled implants can be used to form the source and drain regions 36a and 36b along the substrate trench 14 sidewalls. Alternatively, the source and drains may be formed by diffusion from a source. FIG. 9 is a perspective view of the structure formed following Step 5 of the process.

Figure 10A:
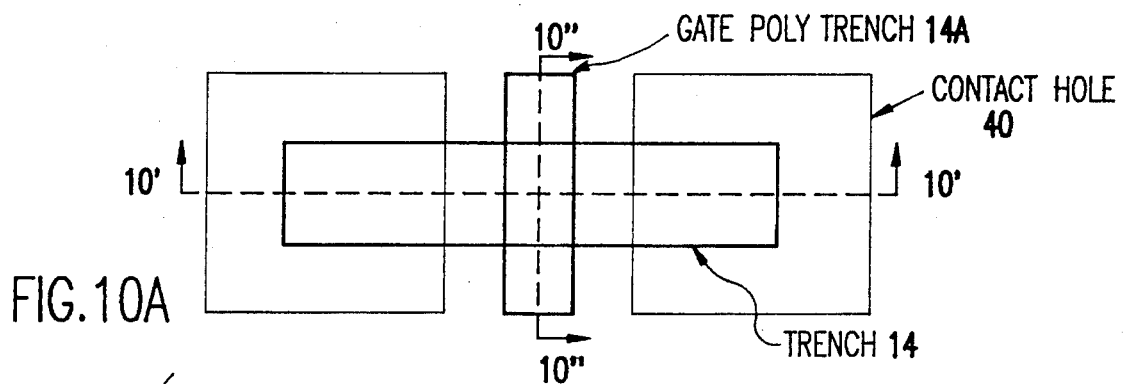
FIG. 10A is a top view of the substrate trench and gate electrode trench after Step 6.
Figure 10B:
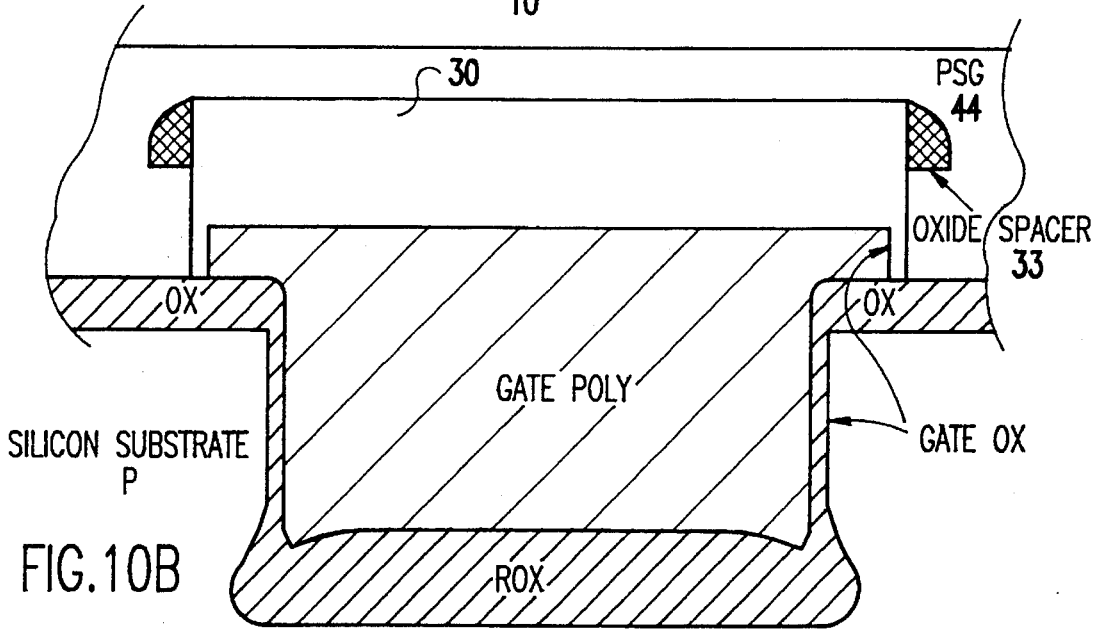
FIG. 10B is a side cross-sectional of the gate electrode trench, taken along line 10"—10" of FIG. 10A, following Step 6 of the process of the present invention.
Figure 10C:
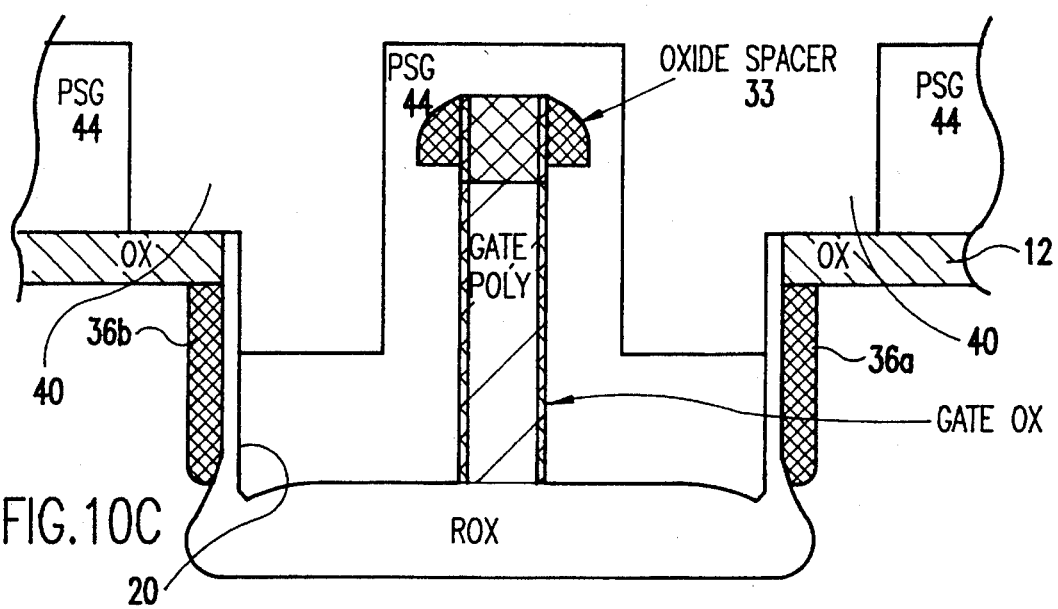
FIG. 10C is a side cross-sectional view of the substrate trench, taken along line 10'—10' of FIG. 10A, following Step 6 of the process of the present invention.

Referring to FIGS. 10A to 10C, Step 6 will now be described. The i-poly spacers 22 are etched selectively to oxide by an anisotropic RIE, the trenches are then overfilled with phosphosilicate glass (PSG) 44 and then planarized to a level above the cap oxide 30.

Conventional completion processing then produces the desired FET device. For example, a typical completion process would include another mask step, followed by etching contact holes 40 (by an anisotropic RIE) at selected locations to expose only the source and drain sidewalls. Metal would then be deposited in the contact holes to complete the desired device.

While the invention has been described in terms of the embodiments described above, those skilled in the art will recognize that the invention can be practiced with modification within the spirit and scope of the appended claims.

Having thus described my invention, what I claim as new and desire to secure by Letters Patent is as follows:

1. A method of forming a self-aligned gate sidewall spacer in a corrugated field effect transistor (FET) structure, comprising the steps of:

depositing a first oxide layer on a substrate;

forming a substrate trench in the substrate, thereby defining a substrate trench bottom and substrate trench sidewalls;

forming a gate electrode trench intersecting the substrate trench and filling the gate electrode trench with gate polysilicon for forming a gate electrode, said gate electrode defining first and second gate sidewalls;

depositing a second oxide layer over the gate electrode trench and said substrate trench; and etching the second oxide layer for forming a sidewall spacer on each of said first and second gate sidewalls.

2. The method as in claim 1 wherein the first and second oxide layers are silicon dioxide.

3. The method as in claim 1, wherein said step of forming the substrate trench further comprises a step of forming silicon nitride spacers on the substrate trench sidewalls, said silicon nitride spacers then being directionally etched.

4. The method as in claim 3, wherein said step of forming the substrate trench further comprises a step of depositing a thermal oxide layer on the substrate trench bottom.

5. The method as in claim 4, wherein said step of forming the gate electrode further comprises a step of depositing a first layer of tetraethylorthosilicate (TEOS) over the substrate trench, and a step of overfilling the substrate trench with intrinsic polysilicon.

6. The method as in claim 5, wherein said step of forming the gate electrode further comprises a step of depositing a silicon nitride layer over said intrinsic polysilicon layer.

7. The method as in claim 6, wherein said step of forming the gate electrode further comprises a step of etching a gate electrode image in said silicon nitride layer and said intrinsic polysilicon layer for forming a gate electrode trench, and a step of overfilling the gate electrode trench with gate polysilicon.

8. The method as in claim 7, wherein said step of forming the gate electrode further comprises a step of selectively recessing the gate polysilicon down to the silicon nitride layer for forming a recess, and a step of filling the recess with a second layer of TEOS for forming an oxide cap on said gate electrode.

9. The method as in claim 8, wherein said step of etching the second oxide layer further comprises a step of etching the intrinsic polysilicon thereby forming concentric trenches around the gate polysilicon.

10. The method as in claim 1, further comprising the steps of:

forming source and drain regions in the substrate trench sidewalls; and overfilling the gate electrode and said substrate trench with an oxide and etching contact holes to expose the source and drain regions in substrate trench sidewalls.

11. A method of forming a self-aligned gate sidewall spacer in a corrugated field effect transistor (FET) structure, comprising the steps of:

depositing a first oxide layer on a substrate;

etching a substrate trench in the first oxide layer and the substrate, thereby defining a substrate trench bottom and substrate trench sidewalls;

forming nitride spacers on the substrate trench sidewalls;

growing a thermal oxide pad layer on the substrate trench bottom;

removing the nitride spacers and depositing a first layer of tetraethylorthosilicate (TEOS) on the substrate trench sidewalls;

overfilling the substrate trench with intrinsic polysilicon;

depositing a nitride layer;

etching a gate electrode image in the nitride layer and intrinsic polysilicon for forming a gate electrode trench;

growing a gate oxide on walls of the gate electrode trench;

overfilling the gate electrode trench with gate polysilicon for forming a gate electrode having first and second gate sidewalls;

recessing the gate polysilicon to a level below that of the nitride layer;

filling the recess with a second layer of TEOS;

removing the nitride layer;

depositing a second oxide layer;

etching the second oxide layer;

etching the intrinsic polysilicon, stopping at the thermal oxide pad, thereby forming intrinsic polysilicon spacers on each of said first and second gate sidewalls;

forming source and drain regions in the substrate trench sidewalls;

removing the intrinsic polysilicon spacers selectively to oxide;

overfilling the substrate and said gate electrode trenches with phosphosilicate glass (PSG) and planarizing the PSG to a level above the second layer of TEOS; and etching contact holes to expose the source and drain regions.

12. The method as in claim 11, wherein the first and second oxide layers are silicon dioxide.

13. The method as in claim 11, wherein the source and drain regions are formed by one of angled implants and diffusion.

* * * * *